(12) United States Patent
Werschler et al.

(10) Patent No.: US 12,140,496 B2
(45) Date of Patent: Nov. 12, 2024

(54) METHOD FOR CORRECTING A TIME-DEPENDENT MEASUREMENT SIGNAL OF A MOTOR TRANSMISSION UNIT AS WELL AS A METHOD FOR DETECTING WEAR AND/OR DAMAGE OF THE SAME BY MEANS OF THIS CORRECTION METHOD

(71) Applicant: IMS GEAR SE & CO. KGAA, Donaueschingen (DE)

(72) Inventors: Marco Werschler, Radolfzell (DE); Florian Werschler, Rottweil (DE); Marcel Mittelbach, Schluchsee (DE); Florian Hamburger, Tuebingen (DE)

(73) Assignee: IMS GEAR SE & CO. KGAA, Donaueschingen (DE)

( * ) Notice: Subject to any disclaimer, the term of this patent is extended or adjusted under 35 U.S.C. 154(b) by 570 days.

(21) Appl. No.: 17/549,112

(22) Filed: Dec. 13, 2021

(65) Prior Publication Data

US 2022/0187165 A1 Jun. 16, 2022

(30) Foreign Application Priority Data

Dec. 14, 2020 (EP) .................................. 20213829

(51) Int. Cl.
*G01M 13/021* (2019.01)
*G01L 3/10* (2006.01)
(Continued)

(52) U.S. Cl.
CPC ............. *G01M 13/021* (2013.01); *G01L 3/10* (2013.01); *G01L 3/1464* (2013.01);
(Continued)

(58) Field of Classification Search
CPC .. G01M 13/021; G01M 13/02; G01R 23/165; G01R 23/18; G01L 5/26; G01L 3/10; G01L 3/1464; G01L 3/1471
See application file for complete search history.

(56) References Cited

U.S. PATENT DOCUMENTS

| | | | |
|---|---|---|---|
| 6,590,362 B2* | 7/2003 | Parlos | G01R 31/343 318/801 |
| 2004/0050177 A1 | 3/2004 | Grosjean | |

FOREIGN PATENT DOCUMENTS

| | | |
|---|---|---|
| CA | 2585560 A1 | 9/2008 |
| DE | 102011121789 A1 | 6/2013 |
| JP | 2001278081 A * | 10/2001 |

OTHER PUBLICATIONS

European Search Report issued Jun. 9, 2021, for corresponding application EP 202113829.3.

* cited by examiner

*Primary Examiner* — Paul M. West
(74) *Attorney, Agent, or Firm* — Nath, Goldberg & Meyer; Jerald L. Meyer (57) ABSTRACT

A method for correcting a time-dependent measurement signal generated by means of an electric motor coupled on the output side to a transmission with regard to the influence of a variable output load and a variable rotational speed includes: tapping a time-varying measurement signal which is dependent on a torque of the motor transmission unit; generation of a useful signal, which is free of any DC component, from the measurement signal; interval-by-interval determination of RMS values from the measurement signal; generation of a load-corrected useful signal by an interval-by-interval division of the useful signal, which is free of any DC component, by the interval-specific RMS values; time-resolved determination of the rotational fre- (Continued)

quency of the motor from the measurement signal; scaling the load-corrected useful signal to the mean rotational frequency to generate a corrected measurement signal, and, use of the corrected measurement signal for fault detection of the motor transmission unit.

9 Claims, 7 Drawing Sheets

(51) Int. Cl.
    *G01L 3/14*     (2006.01)
    *G01L 5/26*     (2006.01)
    *G01R 23/165*     (2006.01)
    *G01R 23/18*     (2006.01)
(52) U.S. Cl.
    CPC .............. *G01L 3/1471* (2013.01); *G01L 5/26* (2013.01); *G01R 23/165* (2013.01); *G01R 23/18* (2013.01)

METHOD FOR CORRECTING A TIME-DEPENDENT MEASUREMENT SIGNAL OF A MOTOR TRANSMISSION UNIT AS WELL AS A METHOD FOR DETECTING WEAR AND/OR DAMAGE OF THE SAME BY MEANS OF THIS CORRECTION METHOD

The invention relates to a method for correcting a time-dependent measurement signal which is generated by means of a motor, in particular an electric motor, coupled to a transmission on the output side. The correction is carried out taking into consideration the influence of a variable output load and a variable rotational speed on the time-dependent measurement signal, in order to thereby make measurement signals from such different operating states comparable. The invention further relates to a method for detecting wear and/or damage to a motor transmission unit, having an electric motor and a transmission coupled to the same on the output side, by means of the correction method.

Electromechanical transmissions consisting of an electric motor and a transmission on the output side are becoming increasingly important, in particular as components of larger units, such as, for example, vehicles or manufacturing systems.

For such applications, fault-free operation is desirable. Mechanical damage to such electromechanical transmissions leads to failures and undesirable repair costs. To avoid such disadvantages, damage to components on such electromechanical transmissions should be detected at an early stage, for example, on the basis of a time-dependent monitoring of condition.

Such a method is known, for example, from DE 10 2016 222 660 A1, in which the following method steps are carried out to detect damage and/or wear on translationally moving parts of an electromechanical transmission:
- measurement of the electric current supplied to the electric transmission,
- performance of a time-frequency analysis,
- comparison of the frequency spectrum of the measured electric current determined from the time-frequency analysis with a predetermined frequency spectrum, and
- triggering of an error signal when a deviation of predetermined magnitude is detected from the comparison of the two frequency spectra.

Furthermore, U.S. Pat. No. 4,965,513 A describes a method for monitoring the operating conditions of an electrically driven valve, in which an analysis of the motor current is carried out. For this purpose, various methods of frequency analysis are applied to the motor current in order to create a noise signature of the motor current, by means of which wear and abnormal operating conditions are to be detected. The noise signature should make it possible to determine different characteristic operating states of the electrically driven valve, and in particular to detect the sum of all the changes in mechanical load, which are manifested in the frequency spectrum and amplitudes. If such noise signatures are created at different time intervals during operation, it should be possible to determine aging and wear, or abnormal operating conditions.

In this prior art, however, it has been shown that the processing of the motor current signals is insufficient to make reliable statements regarding wear and damage in the case of varying operating conditions of the motor transmission unit with an electric motor and a transmission connected to the same on the output side.

It is therefore the task of the invention to specify a method for correcting a time-dependent measurement signal generated by means of an electric motor coupled to a transmission on the output side, so that an analysis of the corrected measurement signal leads to better results compared to the state of the art with regard to wear and/or damage.

Furthermore, it is the task of the invention to provide, on the basis of the correction method, a method for detecting wear and/or damage to a motor transmission unit having an electric motor and a transmission coupled to the same on the output side.

The first-mentioned task is solved by a method having the features of claim 1.

In this method for correcting a time-dependent measurement signal generated by means of an electric motor coupled on the output side to a transmission as regards the influence of a variable output load and a variable rotational speed, the following method steps are carried out:
a) tapping a measurement signal (M) which is dependent on a torque of the motor transmission unit (1),
b) generation of a useful signal (N1), which is free of any DC component, from the measurement signal (M),
c) interval-by-interval determination of RMS values from the measurement signal (M),
d) generation of a load-corrected useful signal (N2) by an interval-by-interval division of the useful signal (N1), which is free of any DC component, by the interval-specific RMS values,
e) time-resolved determination of the rotational frequency (f) of the motor (1) from the measurement signal (M),
f) scaling, in particular standardizing, the load-corrected useful signal (N2 to the mean rotational frequency to generate a corrected measurement signal ($M_{corr}$), and
g) use of the corrected measurement signal for fault detection or wear recognition of the motor transmission unit.

Such a correction method leads to improved signal quality, in particular to an improved signal-to-noise ratio and to better comparability of the corrected measurement signals at different loads, such that analysis methods applied to the corrected measurement signal as regards wear of and/or damage to the motor transmission unit lead to meaningful, qualitatively better results.

Such a corrected measurement signal can be used to perform various analysis methods, such as FFT (Fast Fourier Transform) analysis or envelope curve analysis in the frequency range. Suitable analysis methods in the time range are, for example, determinations of kurtosis, minimum, maximum, RMS, standard deviations, mean values or similar.

The motor current can, for example, be analyzed, as a measurement signal, but also, for example, the torque or any other signal dependent on the torque.

The second task mentioned is solved by a method for detecting wear and/or damage to a motor transmission unit with the features of patent claim 2.

In this method for detecting wear and/or damage to a motor transmission unit having an electric motor and a transmission coupled to the same on the output side, the following method steps are carried out:
- generation of a time-dependent measurement signal by means of the motor transmission unit,
- generation of a corrected measurement signal in accordance with the method according to claim 1,
- determination of a frequency spectrum by means of an FFT (Fast Fourier Transform) analysis starting from the corrected measurement signal, provision of a reference frequency spectrum generated by means of the FFT analysis from a corrected measurement signal of a wear-free and/or damage-free motor transmission unit, and comparison of the frequency spectrum of the corrected measurement signal with the reference frequency spectrum, and determination of wear-indicating and/or damage-indicating features from the comparison of the frequency spectrum of the corrected measurement signal with the reference frequency spectrum.

With the analysis of the corrected measurement signal in the frequency range by means of the FFT analysis, the identification of component-specific features of the motor transmission unit that differ in their expression due to wear and/or damage is made possible.

In this way, according to further developments, each frequency line of the frequency spectrum generated from a corrected measurement signal by means of the FFT analysis is assigned a component-specific feature of the motor transmission unit, and the amplitudes and/or the spectral integral of identical frequency lines of the frequency spectrum of the corrected measurement signal and of the frequency spectrum of the reference frequency spectrum are compared in order to determine a wear-indicating and/or damage-indicating feature.

In this manner it is possible to automatically perform the analysis procedure applied to the corrected measurement signal.

According to an advantageous further development of the invention, method step a) is carried out in which a DC component of the measurement signal is determined and where this component is subtracted from the measurement signal. Preferably, the measurement signal is low-pass filtered to determine the DC component of the measurement signal. With the elimination of the DC component, a frequency analysis of the measurement signal leads to an improved signal quality.

According to a further preferred embodiment of the invention, method steps b) and c) are carried out wherein the measurement signal is divided into temporally successive time sections that are smaller than a predetermined time value, the interval-specific RMS value of the measurement signal is determined for each time interval, and the useful signal free of any DC components is divided by the interval-specific RMS value in order to generate the load-corrected useful signal in each time period.

The time value of the time sections is determined according to the determined rotational frequency on the output side as well as the time length and/or the number of sampling points of the measured time-dependent measurement signal and is, for example, 0.2 s.

For the correction method according to claim 1, as well as for the analysis method according to claim 2, it has turned out to be particularly advantageous if a motor current signal indicating the motor current of the electric motor of the motor transmission unit is generated as a measurement signal.

If, according to a further development, a brush DC motor is used as the electric motor, the method step d) can be carried out in a particularly simple manner, wherein the maximum of the motor current signal and its time values are determined, the rotational frequency or brush frequency is approximately determined from the distance between the maximum of the motor current signal, the number of grooves and the number of brushes of the brush DC motor, the motor current signal is bandpass filtered in the range of the approximately determined rotational frequency or brush frequency, the maximums are determined from the bandpass-filtered motor current signal and their time values, and the rotational frequency or brush frequency of the brush DC motor is determined from the distance of the maximums of the bandpass-filtered motor current signal, the number of grooves, and the number of brushes.

The invention is described in detail below on the basis of the embodiments with reference to the accompanying figures. Wherein.

Figure 1:
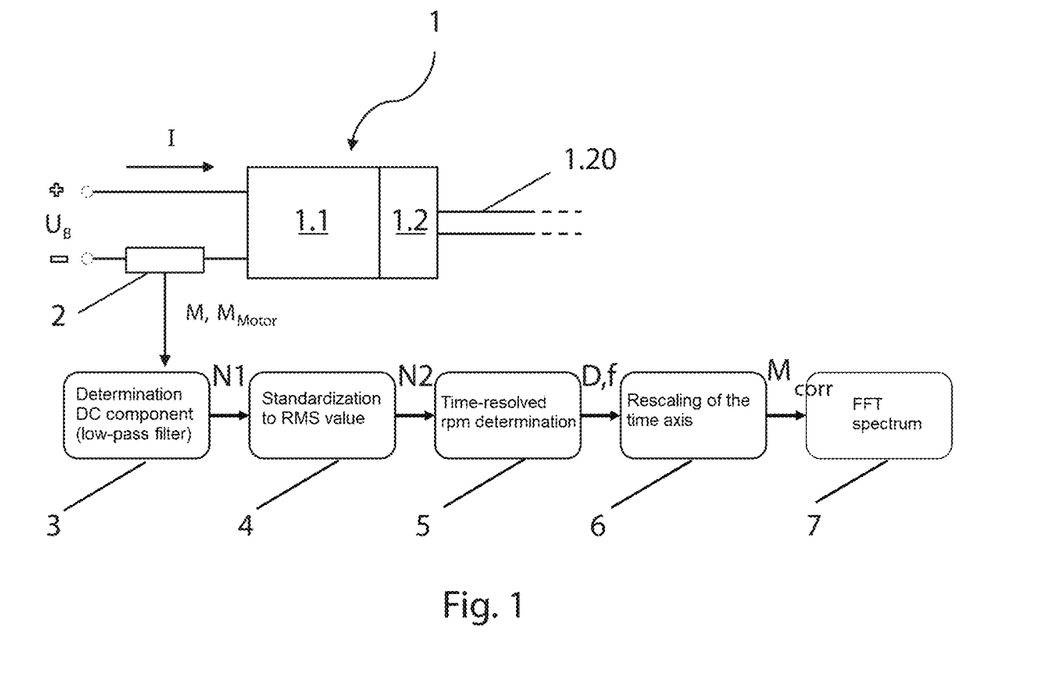
FIG. 1 shows a schematic representation of an example of a system for detecting wear and/or damage to the components of a motor transmission unit.

FIG. 1 schematically shows an example of a system or device for detecting wear and/or damage to components of a motor transmission unit 1. This motor transmission unit 1 has an electric motor 1.1 and a transmission 1.2 connected to it on the output side. The motor 1.1 is preferably an electric motor with a given number of grooves and a given number of brushes. The transmission 1.2 has an output shaft 1.20.

During the operation of the motor transmission unit 1, in this case, a current measurement is carried out by means of a current measurement unit 2, which supplies a time-resolved motor current signal $M_{Motor}$ of the motor current I supplied to the electric motor 1.1 as a measurement signal M.

Figure 2:
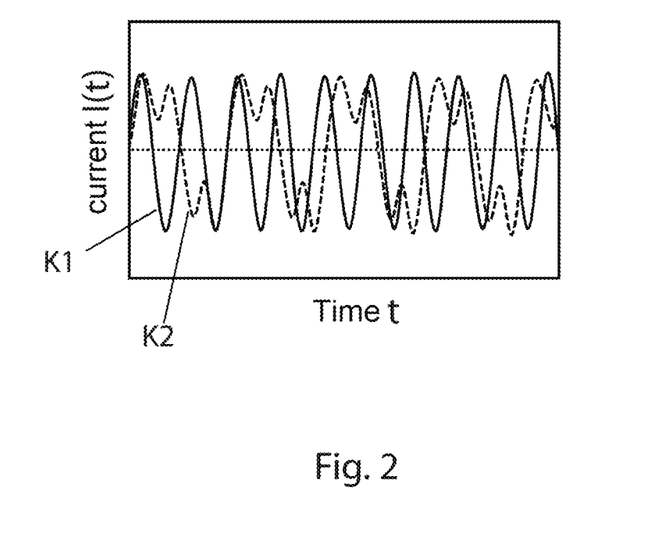
FIG. 2 shows a schematic time-current diagram of a motor current signal for a motor transmission unit in new condition and for a motor transmission unit showing wear.

FIG. 2 schematically shows two examples of the temporal course of the time-dependent motor current signal of a motor transmission unit 1 in different operating states.

Curve K1 (solid line) shows a motor current signal in the time range for a motor transmission unit 1 in new condition, which is to say in such a motor transmission unit 1, neither of the two components: electric motor 1.1 and transmission 1.2 shows any damage or wear.

Curve K2 (dashed line) shows a motor current signal in the time range for a motor transmission unit 1 whose components, which is to say the electric motor 1.1 and/or the transmission 1.2, have/show wear and/or damage.

Different operating states of the motor transmission unit 1, namely an operating state of the motor transmission unit 1 in "as new" state and an operating state of the motor transmission unit 1 exhibiting wear and/or damage, are manifested in the different temporal courses of the two motor current signals depicted by curves K1 and K2. By means of a frequency analysis of these time-dependent motor current signals, wear- and/or damage-specific characteristics can be detected and thus predictive maintenance of a motor transmission unit 1 can be realized. However, a prerequisite for this is that the values from the frequency analysis are comparable at different operating states of the motor transmission unit 1 concerning a varying output load and a varying speed.

To ensure the comparability of the time-dependent measurement signals in different operating states of the motor transmission unit 1, the motor current signal $M_{Motor}$, as time-dependent measurement signal M, is subjected to a correction method before the measurement signal $M_{corr}$ corrected in this way undergoes, for example, an FFT (Fast Fourier Transform) frequency analysis.

Here, FIG. 1 shows basic blocks 3 to 6 as method steps for carrying out the correction method for the motor current signal $M_{Motor}$ as a time-dependent measurement signal M, which is provided by means of a measurement unit 2 for measuring the motor current I of the electric motor 1.1. The individual method steps according to blocks 3 to 6 are explained in detail below.

Figure 3:
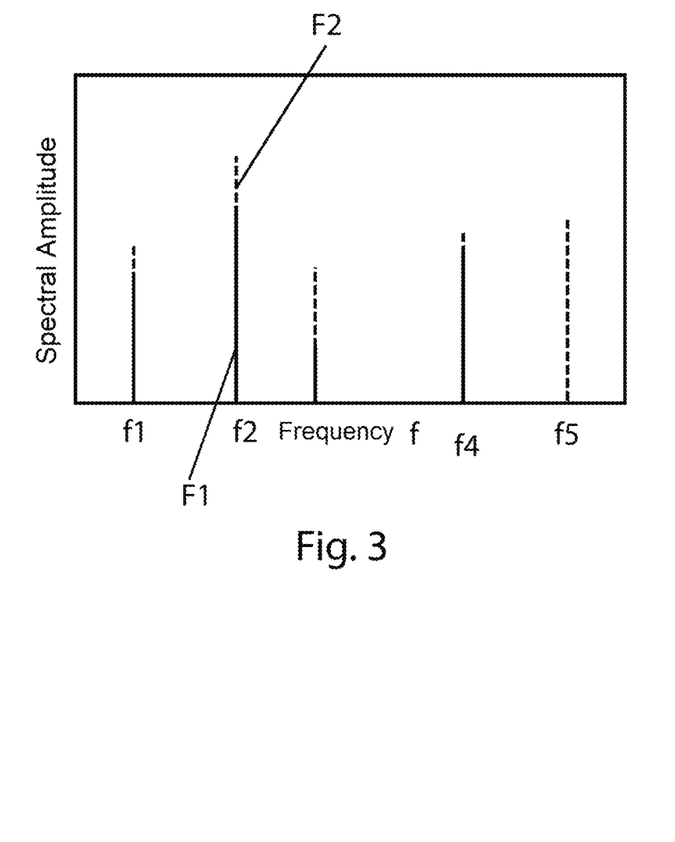
FIG. 3 shows a schematic representation of the motor current signals in the frequency range according to FIG. 2.

The corrected measurement signal $M_{corr}$ generated by the method step according to block 6 is subjected to block 7 for FFT frequency analysis and for generating a frequency spectrum. FIG. 3 shows an example of such a frequency spectrum with frequency lines F1 (solid lines) and F2 (dashed lines), which are generated schematically from the motor current signal according to curves K1 and K2.

FIG. 3 shows five spectral lines f1 to f5, wherein the frequencies of the spectral lines f1 to f4 are identical for both motor current signals according to curves K1 and K2, but with different amplitude characteristics, whereas the spectral line f5 is assigned to the motor current signal according to curve K2.

Each of these spectral lines f1 to f4 can be associated with a specific mechanical feature of the motor transmission unit 1, wherein the value of the amplitude and/or the spectral integral representing the operating condition. In this manner, the F1 spectral lines f1 to f4 indicate an operational condition of the motor transmission unit 1, which therefore does not show any wear or damage. The F2 spectral line f5 indicates damage to the motor transmission unit 1.

Line f1 could, for example, represent the output frequency, line f2 the rotational frequency of the higher level planetary gears, line f3 the same first level planetary gears, line f4 the input frequency, and line f5 a fault rollover frequency of the first stage planetary gears.

It also follows from FIG. 3 that the frequency spectrum of the corrected measurement signal $M_{corr}$ of the measurement signal according to curve K1 can be compared with the frequency spectrum of the corrected measurement signal according to curve K2, and the current operating state of the motor transmission unit 1 in terms of wear and damage can be derived from the comparison result. Furthermore, a trend curve of the wear and/or damage specific properties can also be determined by generating such frequency spectra during temporally successive operating intervals.

In the following, the correction method applied to a motor current signal $M_{motor}$ as measurement signal M is explained according to blocks 3 to 6 (cf. FIG. 1), which is then moved onto block 7 for frequency analysis and generation of a frequency spectrum.

In order to ensure comparability of the frequency spectra under different operating conditions of the motor transmission unit 1, the influences due to the varying output load of the electric motor 1.1 and the varying speed of the electric motor 1.1 must be eliminated.

First, the influence of a varying output load on the motor current signal $M_{motor}$ is to be corrected.

Figure 4:
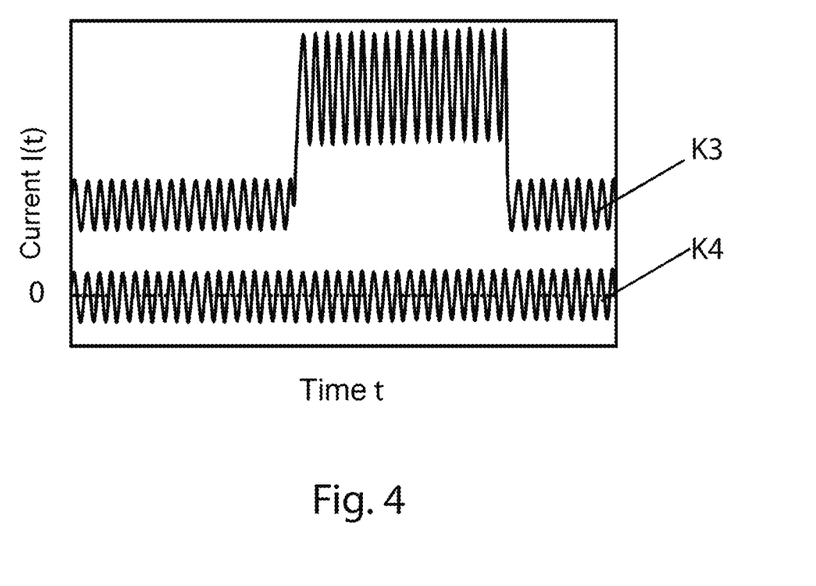
FIG. 4 shows a schematic representation of a motor current signal with and without DC component
Figure 5:
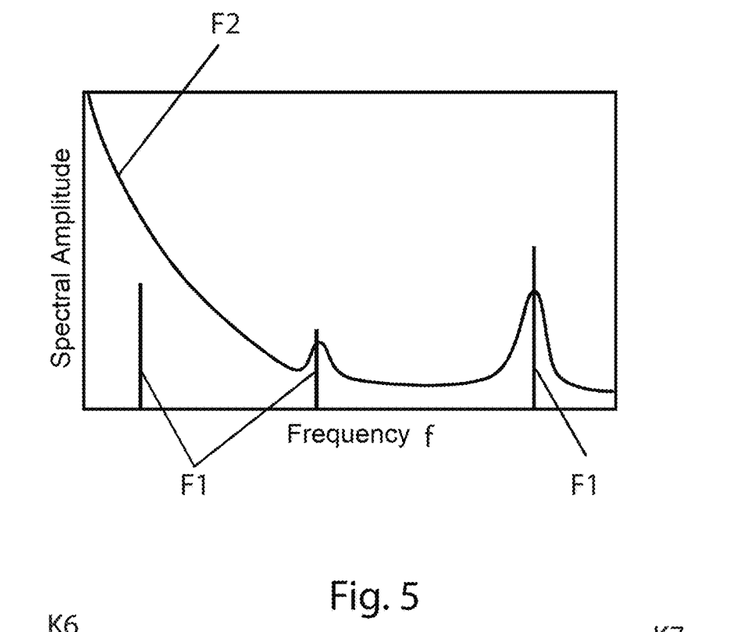
FIG. 5 shows a schematic representation of the motor current signals, in the frequency range, according to FIG. 4.

Due to a fluctuating output load at the electric motor 1.1 during a measurement process, the DC component of the motor current signal $M_{motor}$ changes as a function of time, as shown by curve K3 in FIG. 4. Without the correction method according to the invention, a frequency analysis leads to a frequency spectrum F2 according to FIG. 5, in which the low-frequency range is strongly overlapped by an exponentially decreasing signal. For comparison, FIG. 5 shows the frequency spectrum F1 of a motor current signal $M_{motor}$ in which the DC component is eliminated according to curve K4. In this frequency spectrum F1, the spectral lines are clear and unambiguous, whereas the frequency spectrum F2 cannot be evaluated in the low-frequency range. In this, the elimination of the DC component from the motor current signal $M_{motor}$ is essential for an FFT analysis.

Therefore, in a first method step according to block 3 (cf. FIG. 1), the DC component of the motor current signal $M_{motor}$ is first determined by low-pass filtering it with a cutoff frequency of less than 1 Hz. The signal $S_{same}$ generated in this way corresponds to the curve K5 according to FIG. 6, which corresponds approximately to the DC component of the motor current signal $M_{motor}$, wherein K6 denotes the motor current signal $M_{motor}$ and, for comparison, the curve K7 shows the time-resolved output torque of the motor transmission unit.

Figure 6:
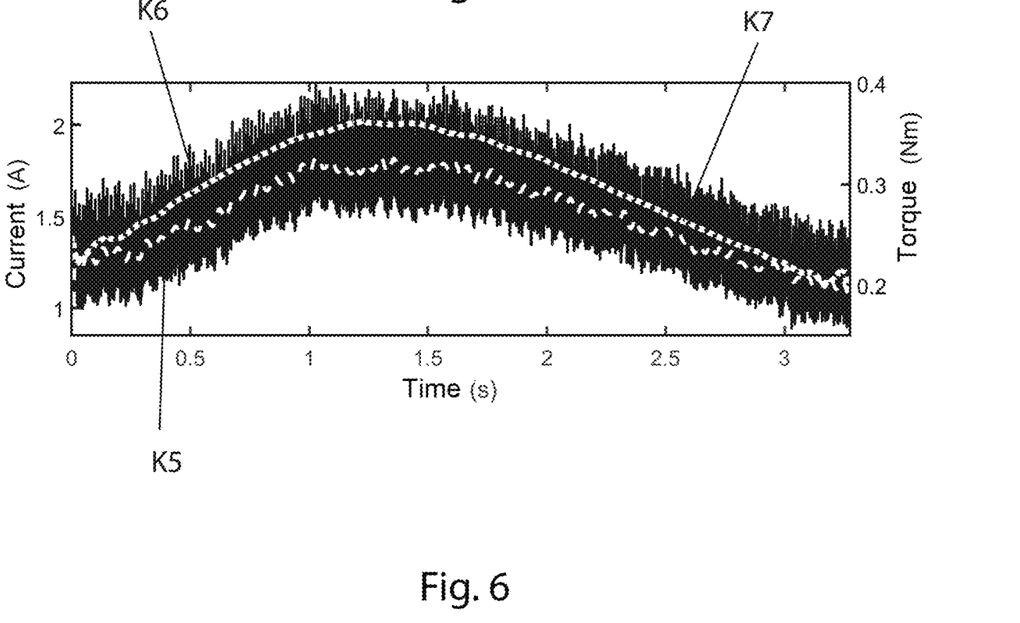
FIG. 6 shows a time-current or alternatively torque-diagram with the temporal course of a motor current signal, its DC component and torque.

The signal $S_{same}$ generated in this way is used, by vectorially subtracting the signal $S_{same}$ from the motor current signal $M_{motor}$, to determine a useful signal N1, which is free of DC components, from the motor current signal $M_{motor}$.

The DC component according to the signal $S_{same}$ follows the course of the applied output or alternatively load torque according to curve K7 in FIG. 6. Due to the varying output load, the amplitudes of the current fluctuations of the motor current signal $M_{motor}$ also change as a result of the rotation of the individual gear components, as can be seen from curve K3 in FIG. 4.

To eliminate these amplitude fluctuations of the motor current signal $M_{motor}$, the useful signal N1, which is free of any DC component, is standardized to the RMS value (cf. FIG. 1, block 4).

For this purpose, the time-resolved, useful signal N1 which is free of any DC component is divided into short successive time segments with a predetermined time value, for example, less than 0.2 s, and an interval-specific RMS value is calculated for these time segments. For this purpose, the signal is divided, for example, into individual parts of adequate length (approximately 0.05 s-0.2 s, a fixed but freely selectable value). A smooth line is adapted to the individual RMS values, whereby a resampling of the number vector of the RMS values (same number of samples as measurement signal) also takes place. Subsequently, the two number vectors are divided point by point. With these interval-specific RMS values, each time segment of the useful signal N1 which is free of any DC component is divided by the associated interval-specific RMS value. With the load-corrected useful signal N2 obtained in this way, the signal amplitudes are standardized, which ensures comparability of different motor current signals $M_{motor}$.

Figure 7:
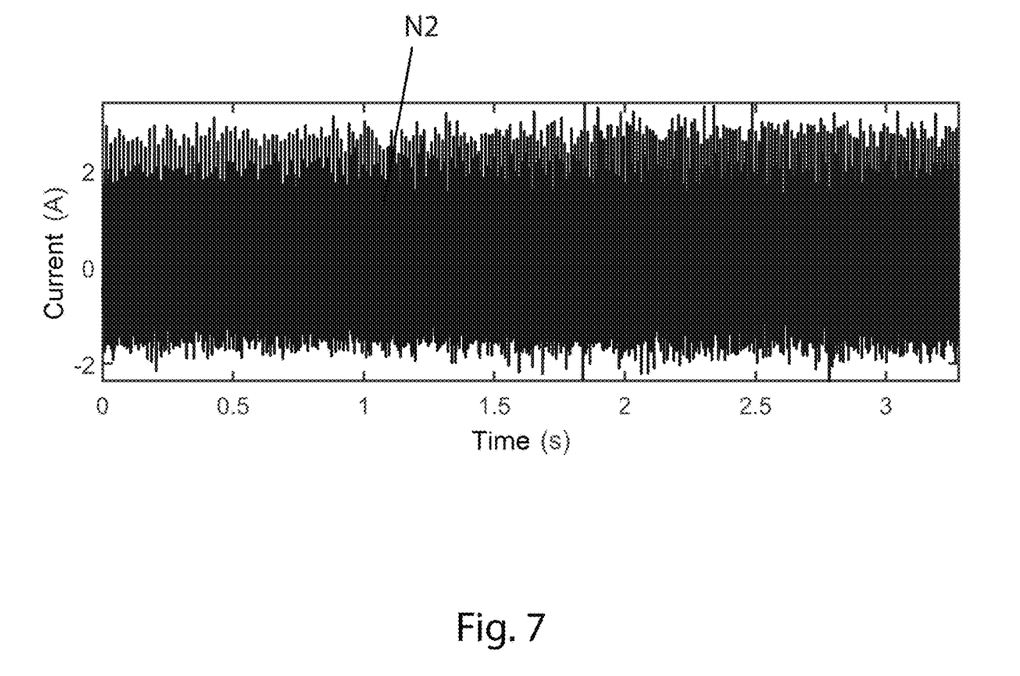
FIG. 7 shows a time-current diagram with a time-resolved useful signal free of the DC component and load-corrected.

According to FIG. 7, the time-resolved useful signal N2 shows neither DC components nor RMS value deviations.

As already explained above, in addition to the output load, the input speed, which is to say the speed of the electric motor 1.1, also influences the signal quality and characteristics of the motor current signal $M_{motor}$.

Therefore, in a next step of the method, the temporal course of the speed of the electric motor 1.1 is determined (cf. block 5, FIG. 1). For this purpose, first the maxima and the associated time values are determined from the motor current signal $M_{motor}$. The time difference of these absolute maxima corresponds to the inverse brush frequency in the case of a DC motor. As a consequence, the times of the local maxima of the time-resolved motor current signal are determined. From the inverse time interval of two successive maxima, a frequency value is respectively calculated. From the average of all these frequency values, the approximate brush frequency is obtained, provided (which is usually the case) that the brush causes the maxima in the time signal. From this approximate brush frequency, the approximate speed can then be determined with the help of the number of brushes and grooves. However, this step is not necessary, because the speed standardization of the signal can also be done via the brush frequency.

Figure 8:
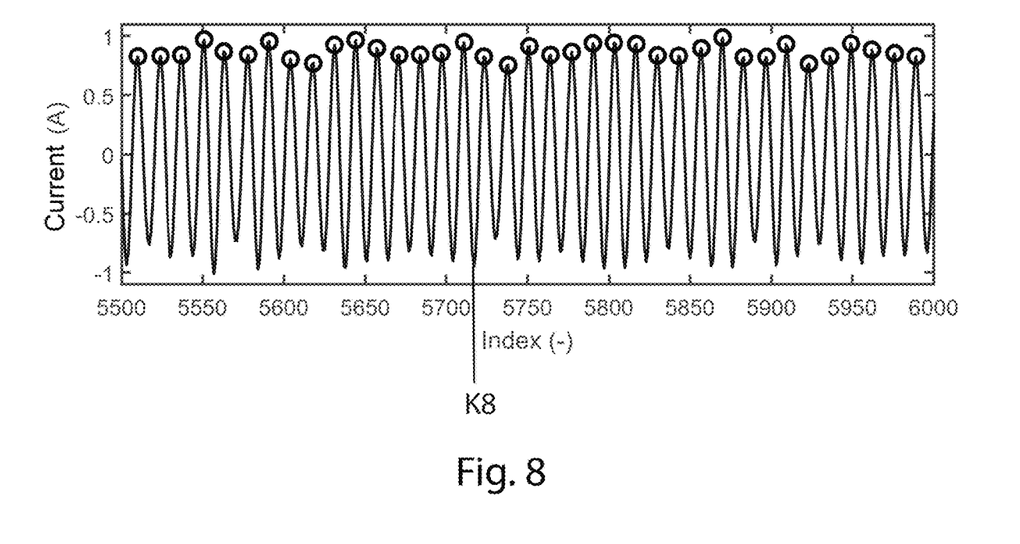
FIG. 8 shows a diagram with the temporal course of a bandpass-filtered motor current signal.
Figure 9:
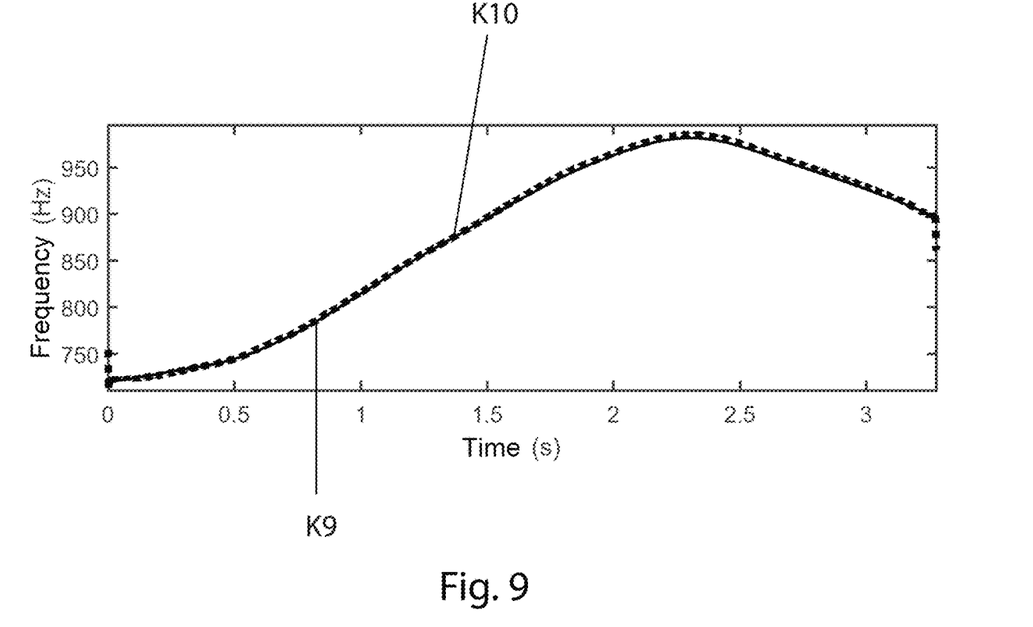
FIG. 9 shows a time-frequency diagram with the temporal course of a brush frequency determined from FIG. 8 and a calculated brush frequency based on measured values.

To determine the actual speed d or alternatively the actual rotational frequency f of the electric motor 1.1, a bandpass filtering of the useful signal N2 (cf. FIG. 7) is carried out in the range of the approximate brush frequency. In so doing, the cut-off frequencies are about +−15% to the brush frequency. The bandpass filtered useful signal N2 shows the curve K8 shown in FIG. 8. The actual brush frequency is calculated from the time interval between the absolute maxima (marked in a circle in FIG. 8) of curve K8. By dividing the number of brushes and the number of grooves, the rotational frequency f or alternatively the actual rotational speed d is obtained. For this purpose, a number vector consisting of the time intervals of the maxima is obtained. By adapting a spline or a similar method and resampling to the same number of samples as the measurement signal, a functional curve is obtained with which the time axis of the measurement signal is scaled, in particular standardized. The curve K9 (the solid line) of FIG. 9 shows the temporal course of the brush frequency calculated from the time interval of the absolute maxima of curve K8. By way of comparison, the brush frequency calculated from the measured rotational frequency is shown as curve K10 (dashed line). Curves K9 and K10 show high degree of coincidence. It should be noted that the rotational frequency can also be determined without first determining the brush frequency. For this, the bandpass filtering is carried out directly in the range of the previously roughly determined rotational frequency.

Figure 10:
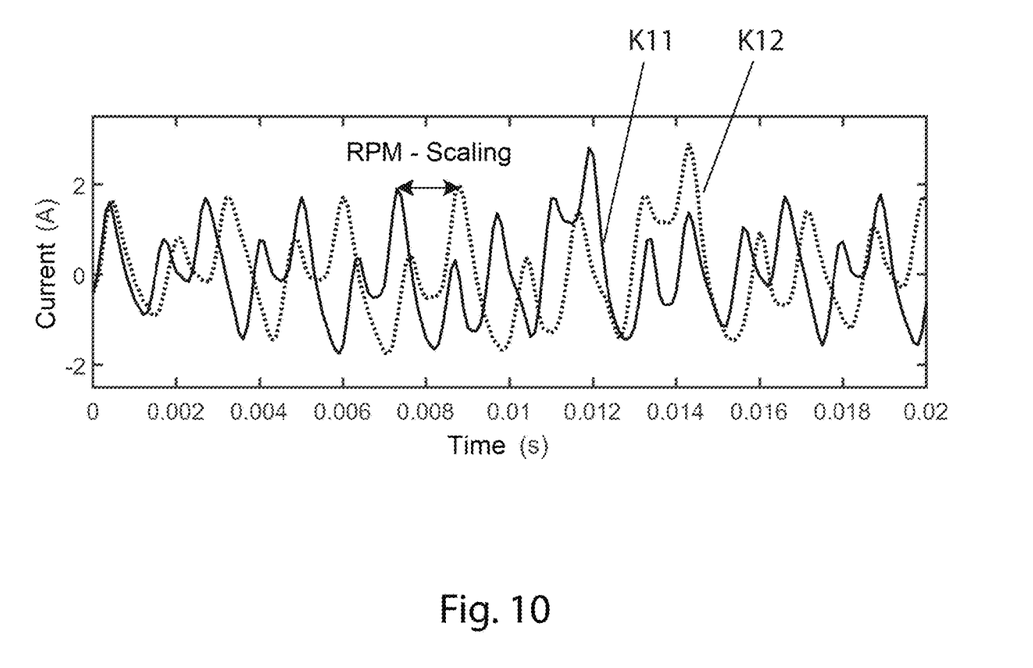
FIG. 10 shows a time-current diagram with the temporal course of a corrected measurement signal $M_{corr}$ and the temporal course of an uncorrected measurement signal M.

With the aid of the determined time-dependent rotational frequency f (cf. FIG. 9), the time axis of the load-corrected useful signal N2 shown in FIG. 7 is standardized or scaled to an average rotational frequency in a method step according to block 6 (cf. FIG. 1). In so doing individual periods of the useful signal N2 which have a higher frequency are stretched out, whereas periods with a lower rotational frequency are compressed. This standardization or alternatively scaling step generates from the load-corrected useful signal N2 the corrected motor current signal, which is to say the corrected measurement signal $M_{corr}$, which is fed to block 7 according to FIG. 1 to generate a frequency spectrum by means of an FFT frequency analysis. FIG. 10 shows the corrected measurement signal $M_{corr}$ as curve K11 (solid line), and, in comparison to it, the curve K12 (dashed line) of the uncorrected motor current signal $M_{motor}$ or alternatively measurement signal M.

As already elucidated, the corrected measurement signal $M_{corr}$ is subjected to an FFT frequency analysis and an FFT spectrum F3 (cf. FIG. 11, solid line) is generated. In comparison, FIG. 11 shows an FFT spectrum F4 (dashed line) of the uncorrected measurement signal M.

The FFT spectrum F3 of the corrected measurement signal $M_{corr}$ shows sharply defined maxima that can be clearly assigned to individual characteristic transmission and/or motor properties and thus serve as a basis for determining damage and wear. These maxima, sharply defined as spectral lines, can be clearly distinguished from the background noise. The frequency spectrum F3 shows five spectral lines f1 to f5, which, for example, are unambiguously assigned to the following transmission properties or alternatively motor properties. Rotational frequencies of individual gears, defect frequencies, input and output rotational frequencies, etc. In other words, each distinct spectral line f1 to f5 can be assigned to a very specific motor or gear component or its behavior.

If such FFT spectra F3 are respectively generated after a different number of operating hours, the respective amplitudes and/or spectral integrals are comparable despite different output loads of the transmission 1.2 and different speeds of the electric motor 1.1 of a motor transmission unit 1.

Figure 11:
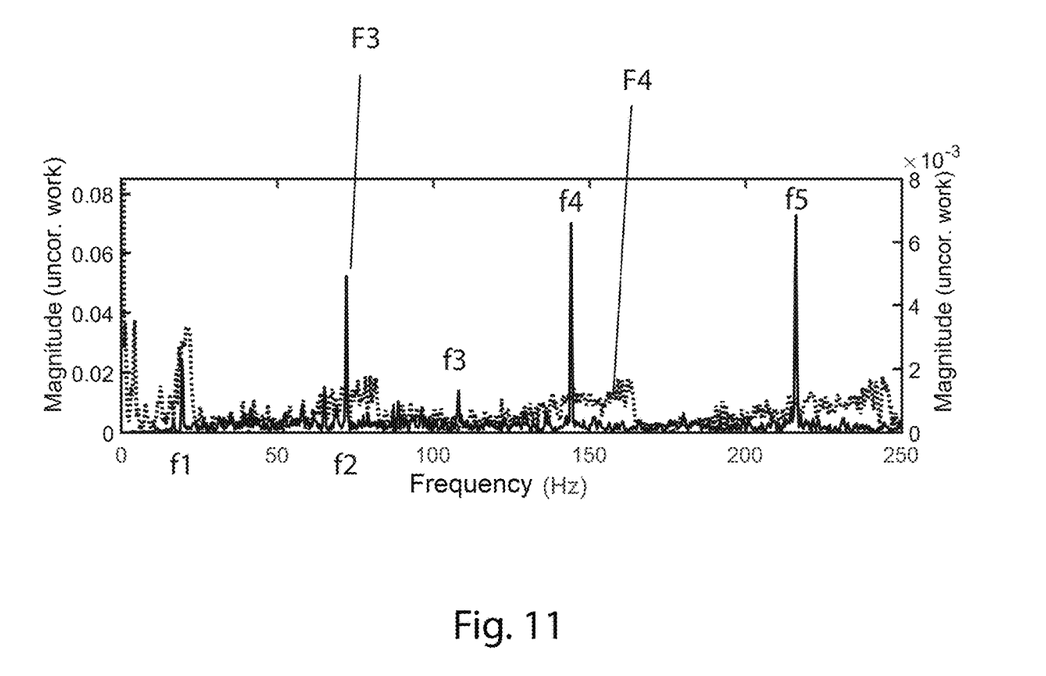
FIG. 11 shows a frequency spectrum of the measurement signals $M_{corr}$ and M shown in FIG. 10.

If the FFT spectrum F4 of the uncorrected measurement signal M according to FIG. 11 is compared with the FFT spectrum of the corrected measurement signal $M_{corr}$, it can be seen that due to the varying output load of the transmission 1.2 and the varying speed of the electric motor 1.1, no sharp maxima can be detected. Rather, weakly pronounced features disappear in the background noise. Furthermore, strongly pronounced features are heavily smudged due to the rotational speed fluctuations and no clear frequency assignment and consequently also no component-specific feature identification can be made.

Figure 12A:
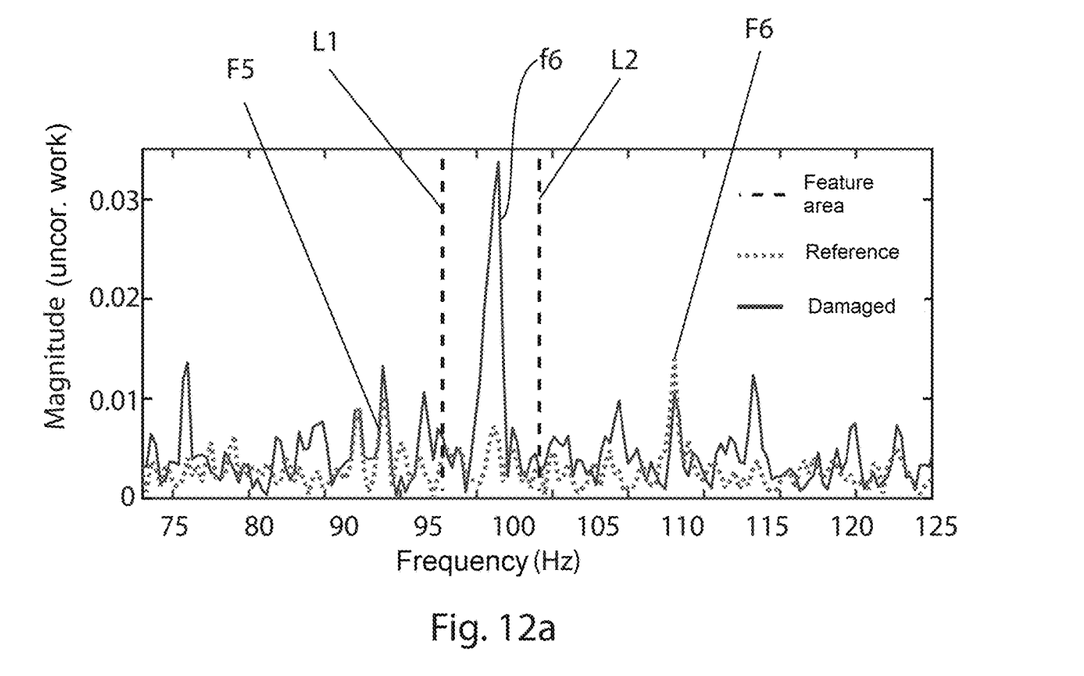
FIG. 12a shows a cross-section of an FFT spectrum of a corrected measurement signal $M_{corr}$ of a motor transmission unit with gear damage and a corrected measurement signal of an intact motor transmission unit serving as reference.

By way of example, FIG. 12a shows, in the frequency range, a section of an FFT spectrum F5 of a corrected motor current signal as a corrected measurement signal $M_{corr}$ of gear tooth damage on a planetary gear of a transmission 1.2 of a motor transmission unit 1 designed as a planetary gear. The damage-specific feature is recognizable as a distinct spectral line f6 between lines L1 and L2. Dashed line F6 shows a corrected signal of an intact motor transmission unit as a reference.

Figure 12B:
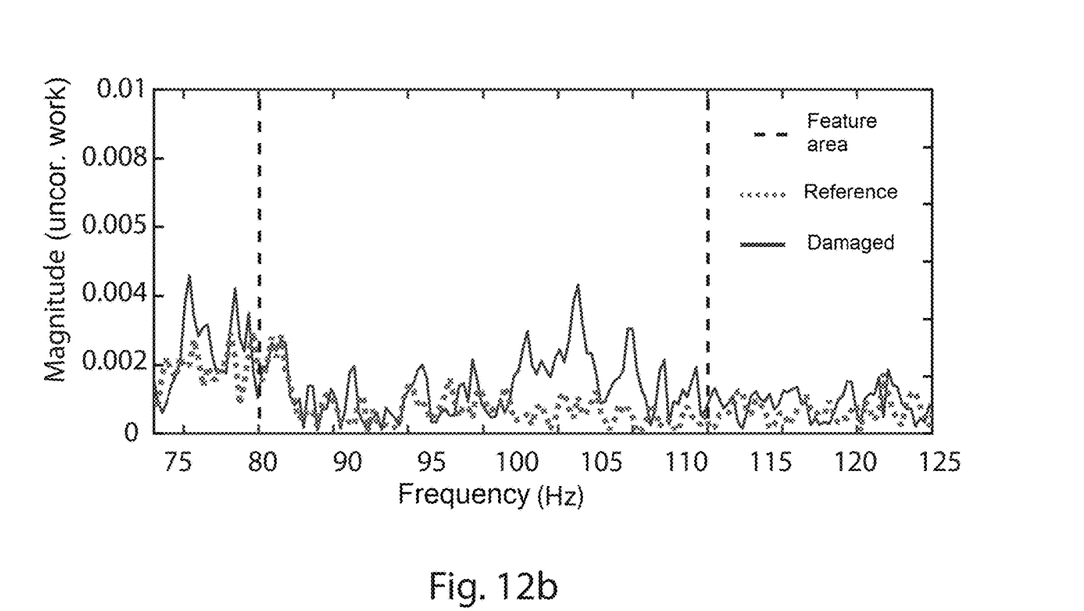
FIG. 12b shows a representation similar to FIG. 12a, however without correction of the measurement signal.

By way of comparison, FIG. 12b shows the motor current signal in the uncorrected state, and not according to the previously known method, this in comparison to a reference of an intact motor transmission unit. FIG. 12b thereby shows the damaged transmission at variable load and speed in the range of the defect rollover frequency of a planetary gear stage. Both the range for this frequency (black dashed line) and the amplitudes are very heavily smudged, such that no meaningful comparison can be made. The dotted dash line represents the uncorrected signal from FIG. 11 and here serves as a reference. FIG. 12a shows the corrected case according to this method.

The correction method according to the invention not only significantly improves the signal-to-noise ratio, but also substantially reduces the bandwidth over which wear- and/or damage-specific features extend. These two positive properties predestine the correction method according to the invention for a real-world application to motor transmission units under varying environmental solicitations.

In the embodiment examples described above, the measurement signal M, as motor current signal $M_{motor}$, records the course of the motor current I of the electric motor 1.1 of the motor transmission unit 1 (cf. FIG. 1). The measurement signal M can also be generated in another way, for example as an audio signal by means of a microphone, by means of an acceleration sensor, torque sensor, or the like, arranged on the motor transmission unit 1.

It is within the scope of the present invention that emerging wear or emerging damage of the motor transmission unit can be detected with the evaluation of the measurement signal, for example, in particular, of the motor current. This can be used to indicate, in a display device, a potential remaining service life for the motor transmission unit, until which time the motor transmission unit can still remain in service largely free of faults. In addition, on the basis of the acquired measurement signals, warning signals can also be given by means of the display device as soon as a certain wear pattern has been detected.

The method according to the invention can be applied, for example, in actuators for motor vehicles, in production machines, robots or the like.

The invention claimed is:

1. Method for correcting a time-dependent measurement signal (M) generated by means of a motor (1.1) coupled on the output side to a transmission (1.2) with regard to the influence of a variable output load and a variable rotational speed, in which the following method steps are carried out:
    a) tapping a measurement signal (M) which is dependent on a torque of the motor transmission unit (1),
    b) generation of a useful signal (N1), which is free of any DC component, from the measurement signal (M),
    c) interval-by-interval determination of RMS values from the measurement signal (M),
    d) generation of a load-corrected useful signal (N2) by an interval-by-interval division of the useful signal (N1), which is free of any DC component, by the interval-specific RMS values,
    e) time-resolved determination of the rotational frequency (f) of the motor (1) from the measurement signal (M),
    f) scaling the load-corrected useful signal (N2 to the mean rotational frequency to generate a corrected measurement signal ($M_{corr}$), and
    g) use of the corrected measurement signal for fault detection of the motor transmission unit.

2. Method according to claim 1, in which method step a) is carried out, wherein
    a DC component of the measurement signal (M) is determined, and
    the DC component is subtracted from the measurement signal (M).

3. Method according to claim 2, wherein for determining the DC component of the measurement signal, the measurement signal is low-pass filtered.

4. Method according to claim 1, in which the method steps b) and c) are carried out, wherein
    the measurement signal (M) is divided into temporally successive time sections that are smaller than a predetermined time value,
    the interval-specific RMS value of the measurement signal (M) is determined for each time interval, and
    the useful signal (N2) free of any DC components is divided by the interval-specific RMS value in order to generate the load-corrected useful signal (N2) in each time period.

5. Method according to claim 1, in which a motor current signal ($M_{motor}$) indicating the motor current (I) of the electric motor (1.1) of the motor transmission unit (1) is generated as time-dependent measurement signal (M).

6. Method according to claim 5, in which method step e) is carried out wherein
    the maximum of the motor current signal ($M_{motor}$) and its time values are determined,
    the rotational frequency (f0) or brush frequency is approximately determined from the distance between the maximum of the motor current signal ($M_{motor}$), the number of grooves and the number of brushes of the brush DC motor,
    the motor current signal ($M_{motor}$) is bandpass filtered in the range of the approximately determined rotational frequency (f0) or brush frequency,
    the maximums are determined from the bandpass-filtered motor current signal and their time values, and
    the rotational frequency (f) of the brush DC motor is determined from the distance of the maximums of the bandpass-filtered motor current signal, the number of grooves and the number of brushes.

7. Method for detecting wear and/or damage to a motor transmission unit (1) having a motor (1.1) and a transmission (1.2) coupled to the same on the output side, in which the following method steps are carried out:
    generation of a time-dependent measurement signal (M) by means of the motor transmission unit (1),
    generation of a corrected measurement signal ($M_{corr}$) in accordance with the method according to claim 1,
    determination of a frequency spectrum (F3, F5) by means of an FFT (Fast Fourier Transform) analysis starting from the corrected measurement signal ($M_{corr}$),
    provision of a reference frequency spectrum generated by means of the FFT analysis from a corrected measurement signal of a wear-free and/or damage-free motor transmission unit, and
    comparison of the frequency spectrum (F3, F5) of the corrected measurement signal ($M_{corr}$) with the reference frequency spectrum, and
    determination of wear-indicating and/or damage-indicating features from the comparison of the frequency spectrum of the corrected measurement signal (F3, F5) with the reference frequency spectrum, signaling of an emerging wear or an emerging damage.

8. Method according to claim 7, wherein
    each frequency line of the frequency spectrum generated from a corrected measurement signal by means of the FFT analysis is assigned a component-specific feature of the motor transmission unit, and
    the amplitudes and/or the spectral integral of identical frequency lines of the frequency spectrum of the corrected measurement signal and of the frequency spectrum of the reference frequency spectrum are compared in order to determine a wear-indicating and/or damage-indicating feature.

9. Device for detecting wear and/or damage to a motor transmission unit (1), which has a processing device by means of which the method steps of claim 7, can be carried out.

* * * * *